United States Patent
Xu

(10) Patent No.: US 8,609,471 B2
(45) Date of Patent: Dec. 17, 2013

(54) PACKAGING AN INTEGRATED CIRCUIT DIE USING COMPRESSION MOLDING

(75) Inventor: Jianwen Xu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 1139 days.

(21) Appl. No.: 12/039,913

(22) Filed: Feb. 29, 2008

(65) Prior Publication Data

US 2009/0221114 A1    Sep. 3, 2009

(51) Int. Cl.
*H01L 21/00* (2006.01)

(52) U.S. Cl.
USPC .................................. 438/127; 257/E21.001

(58) Field of Classification Search
USPC .................. 438/106–107, 113, 118, 127; 257/E21.001
See application file for complete search history.

(56) References Cited

U.S. PATENT DOCUMENTS

| | | | |
|---|---|---|---|
| 4,918,811 A | 4/1990 | Eichelberger et al. | |
| 5,032,543 A | 7/1991 | Black et al. | |
| 5,144,747 A | 9/1992 | Eichelberger | |
| 5,250,843 A | 10/1993 | Eichelberger | |
| 5,866,952 A | 2/1999 | Wojnarowski et al. | |
| 6,159,767 A | 12/2000 | Eichelberger | |
| 6,897,096 B2 * | 5/2005 | Cobbley et al. | 438/123 |
| 7,015,075 B2 | 3/2006 | Fay et al. | |
| 7,029,949 B2 | 4/2006 | Farnworth et al. | |
| 2004/0201112 A1 * | 10/2004 | Divigalpitiya et al. | 257/783 |
| 2005/0158009 A1 | 7/2005 | Eichelberger et al. | |
| 2005/0264194 A1 * | 12/2005 | Ng et al. | 313/512 |
| 2006/0197066 A1 * | 9/2006 | Cheng et al. | 252/500 |
| 2006/0273469 A1 | 12/2006 | Beer et al. | |
| 2007/0071942 A1 * | 3/2007 | Callaway et al. | 428/95 |
| 2007/0205513 A1 | 9/2007 | Brunnbauer et al. | |
| 2007/0210427 A1 * | 9/2007 | Lytle et al. | 257/678 |
| 2007/0216004 A1 | 9/2007 | Brunnbauer et al. | |

FOREIGN PATENT DOCUMENTS

| | | | |
|---|---|---|---|
| JP | 2001-176896 A | 6/2001 | |
| JP | 2004-006693 A | 1/2004 | |
| JP | 2007-123710 A | 5/2007 | |
| WO | WO 0221595 A2 | 3/2002 | |
| WO | WO 0233751 A2 | 4/2002 | |

OTHER PUBLICATIONS

Brunnbauer et al., An Embedded Device Technology Based on a Molded Reconfigured Wafer, 2006 Electronic Components and Technology Conference, 2006 IEEE, pp. 547-551.
PCT Application No. PCT/US2009/031773 Search Report and Written Opinion mailed Jul. 22, 2009.

* cited by examiner

*Primary Examiner* — William D Coleman
*Assistant Examiner* — Christine Enad
(74) *Attorney, Agent, or Firm* — Schmeiser, Olsen & Watts LLP; Lowell W. Gresham; Charlene R. Jacobsen

(57) ABSTRACT

A structure (46) for holding an integrated circuit (IC) die (50) during packing includes a flexible structurally reinforced silicone adhesive film (22) and a mold frame (44). The mold frame (44) adheres to an adhesive side (38) of the film (22). A method (20) of packaging the IC die (50) includes placing the IC die (50) on the adhesive film (22) with its active surface (52) and bond pads (54) in contact with an adhesive side (38) of the film (22). A molding compound (58) is dispensed over the IC die, and the IC die (50) is encapsulated using compression molding to form a compression molded encapsulant layer (70). IC die (50) is subsequently released from the film (22) as a panel (72) of IC dies (50).

17 Claims, 4 Drawing Sheets

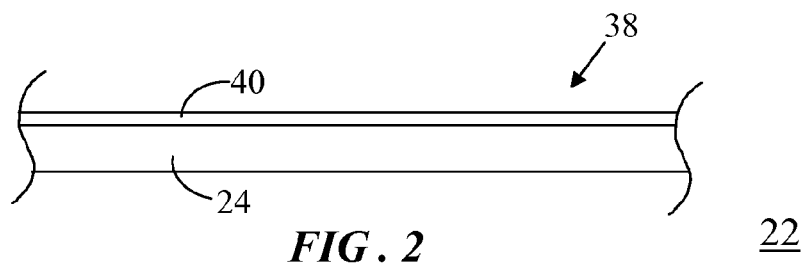
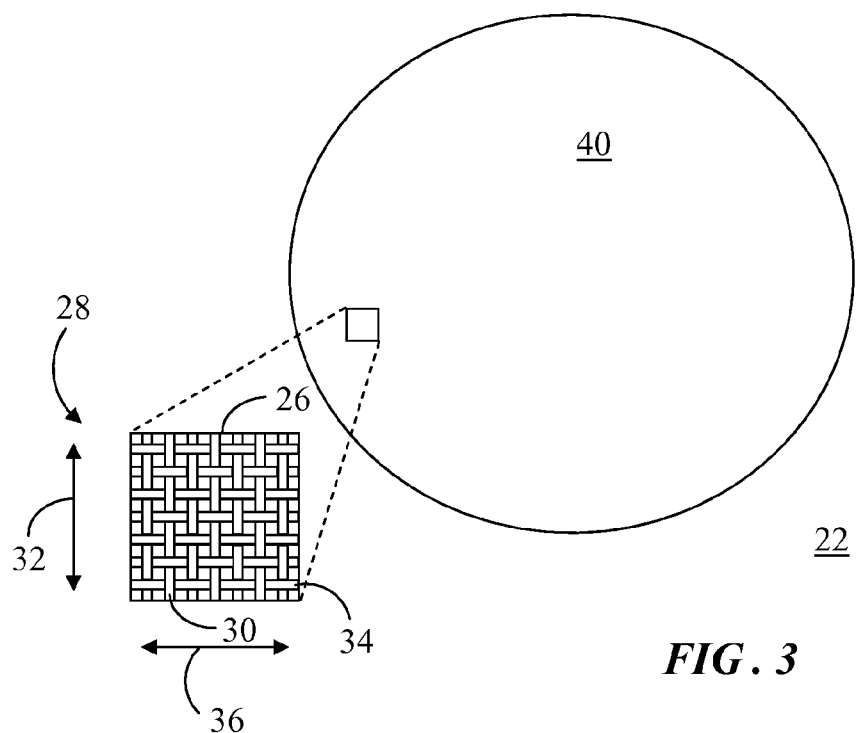
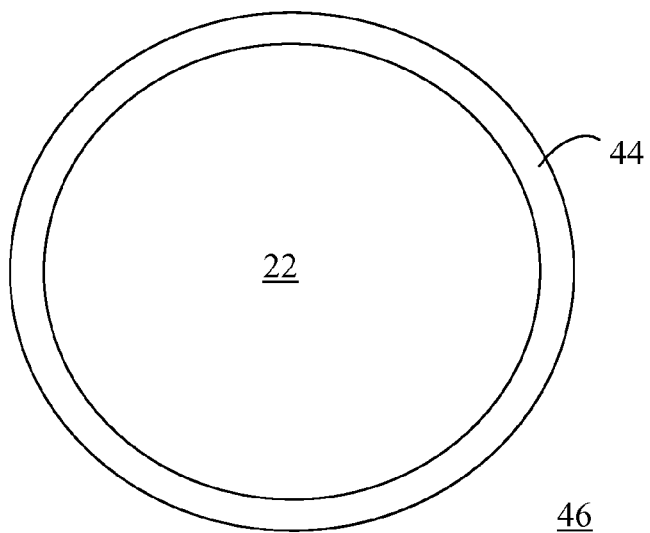

PACKAGING AN INTEGRATED CIRCUIT DIE USING COMPRESSION MOLDING

TECHNICAL FIELD OF THE INVENTION

The present invention relates generally to integrated circuit die packages. More specifically, the present invention relates to utilizing compression molding during chips-first packaging of an integrated circuit die.

BACKGROUND OF THE INVENTION

Integrated circuit packaging is critical in the process of providing small and highly performing semiconductor devices. As such, it has a significant effect on the appearance and function of end-user devices, from computers to cell phones to embedded processors. Integrated circuit (IC) packaging has evolved through multiple types of packaging technologies including, for example, system in package, package on package, chips first packaging, and so forth.

System in package is a technology that allows the placement of several integrated circuits in one package, providing a complete set of device electronics in a small area. Package on package places one package on top of another for greater integration complexity and interconnect density. System in package and package on package techniques typically use wire bonding to connect the IC die and the package. Unfortunately, although wire bonding is a useful packaging technique, the wires take up valuable board space. Accordingly, flip chip techniques have been developed to eliminate wire bonding. In a flip chip process, an IC die is connected face-down to a board or substrate using ball grid array or other conductive bumps. This technique eliminates wire bonds, increases speeds and reduces size.

Chips-first packaging has been developed to counter the limitations of wire bonding and some ball grid array techniques. In chips-first packaging, the IC die or dies are mounted face up to an inert substrate and the interconnect circuit is then built above the IC chips. The interconnect is formed to the IC chips as an integral part of the processing of the circuit board, thus eliminating the need for wire bonds, tape-automated bonds (TABs), or solder bumps.

A conventional chips-first packaging technique entails utilizing a support substrate upon which an acrylic thermal release adhesive tape is attached. To ensure clean release of a panel of IC dies, a silicone adhesive tape is then added on top of the thermal release tape. Each of the IC dies is attached with its active surface, i.e., that surface of the IC die having bond pads, face down on the silicone adhesive to hold it in place. A mold is placed around the IC dies and a molding material (such as a liquid epoxy resin) is then applied over the IC dies within the mold with the tape defining the bottom surface of the mold. After the molding material has been cured, the support substrate is removed from the encapsulated structure and the interconnect circuitry is built above the IC dies.

In the above process, the acrylic thermal release tape is used to facilitate release of the cured encapsulated structure from the support substrate. Unfortunately, thermal release tape can be problematic due to its temperature sensitive nature. In some examples, its adhesion properties can be drastically reduced at elevated temperatures, e.g., at about 150° C., even for the highest temperature grade thermal release tape. Unfortunately, a reduction in the adhesion properties of the thermal release tape can cause the IC dies in some examples to drift from a desired location within the encapsulated structure. In addition, this prior art technique may be undesirably complex, utilizes costly and short shelf life liquid compounds, and requires multiple material layers and processing steps, thus driving up cost and introducing the probability of reliability issues. Accordingly, what is needed is a method for effectively encapsulating IC dies undergoing chips-first packaging that can be readily implemented in existing packaging methodologies.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 2 shows a side view of a structurally reinforced single-side adhesive film of the present invention;

FIG. 3 shows a top view and an enlarged top view of the structurally reinforced single-side adhesive film;

FIG. 4 shows a top view of the structurally reinforced adhesive film with an attached mold frame that together form a structure for temporarily holding at least one integrated circuit (IC) die during packaging thereof;

DETAILED DESCRIPTION

Figure 1:
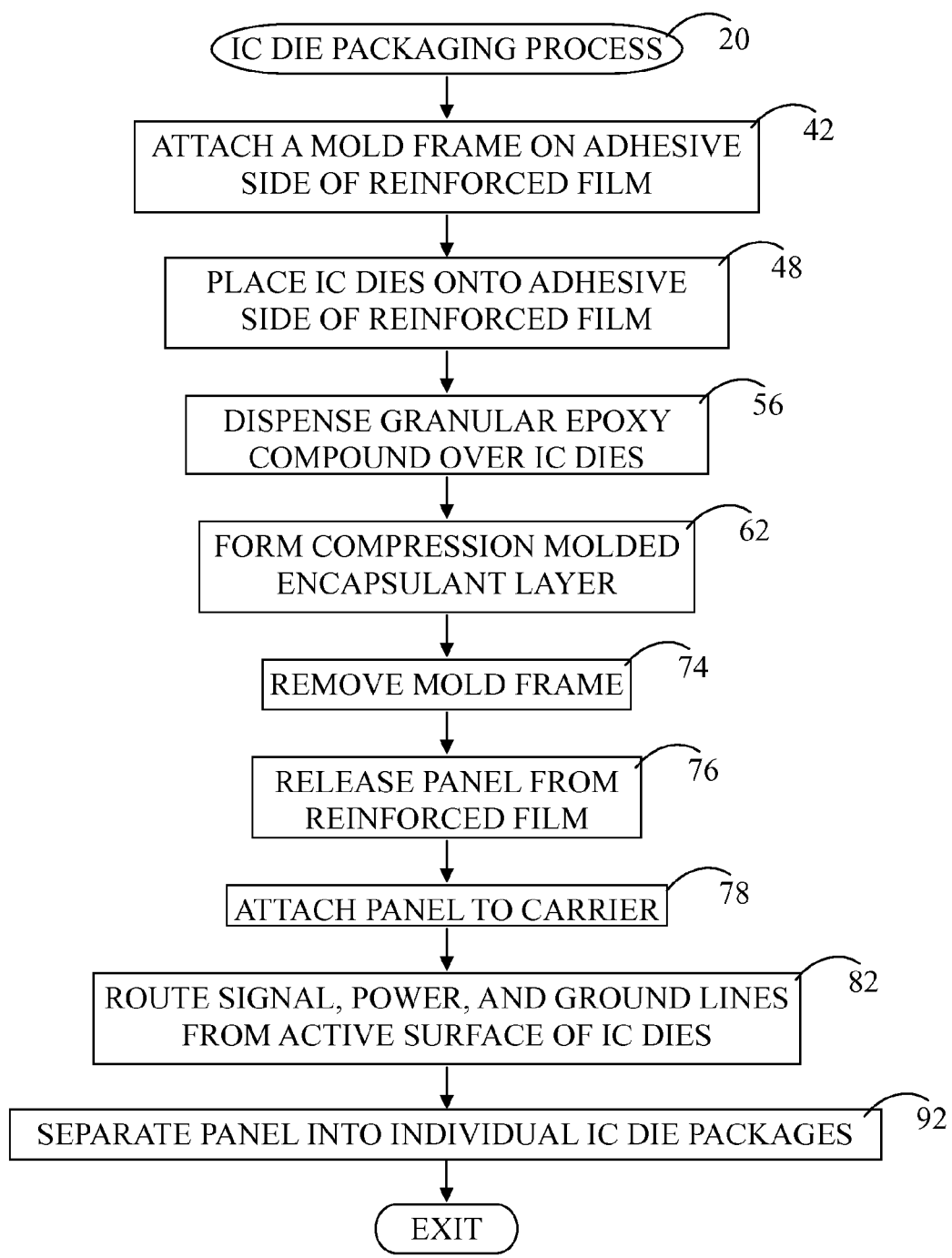
FIG. 1 shows a flowchart of an IC die packaging process in accordance with an embodiment of the invention.

FIG. 1 shows a flowchart of an integrated circuit (IC) die packaging process 20 in accordance with an embodiment of the invention. IC die packaging process 20 describes a chips-first packaging methodology that may eliminate the requirement for a support substrate and associated acrylic thermal release adhesive tape, thereby greatly simplifying the IC die packing process. Moreover, elimination of the temperature sensitive thermal release adhesive tape provides better control of die drift. Furthermore, IC die packaging process 20 employs a compression molding technique using a low cost, long shelf life compound thereby replacing the requirement for the more costly liquid molding compounds of the prior art.

Referring to FIGS. 2-3, FIG. 2 shows a side view of a structurally reinforced single-sided adhesive film 22 of the present invention and FIG. 3 shows a top view and an enlarged format view of structurally reinforced single-sided adhesive film 22. In accordance with an embodiment of the present invention, IC die packaging process 20 (FIG. 1) uses a flexible or bendable substrate, such as a flexible structurally reinforced single-sided adhesive film 22, in lieu of the rigid support substrate, thermal release adhesive tape, and silicone adhesive tape structure of prior art processes so as to greatly simplify IC die packaging.

In one embodiment, flexible structurally reinforced single-sided adhesive film 22 includes a liner 24 formed from a fiber network 26, an exemplary portion of which is shown in an enlarged format view 28 of FIG. 3. Fiber network 26 includes fibers 30 oriented in one direction 32 and fibers 34 oriented in another direction 36 that is orthogonal to direction 32. Fibers 30 and 34 can be interwoven, as shown in enlarged format view 28. In one embodiment, liner 24 of adhesive film 22 includes an approximately equivalent density of each of fibers 30 and 34. The equivalent density of each of fibers 30 and 34 decreases the probability of warpage and enables the effective use of structurally reinforced adhesive film 22 with conventional fabrication equipment, such as a pick and place machine, without compensation. As such, the interwoven configuration and equivalent density of fibers 30 and 34 results in adhesive film 22 having sufficient structural stability in both of directions 32 and 36 to support IC dies (discussed below) during IC die packaging in the absence of the conventionally utilized support substrate and at elevated temperatures.

Liner 24 of adhesive film 22 may be formed from polytetrafluoroethylene (a.k.a., Teflon®) containing woven fiberglass, carbon fibers, carbon nanotubes, or other fibers suitable for reinforcement and for lowering the coefficient of thermal expansion. For purposes of illustration, fiber network 26 is shown as having an ordered or uniform woven pattern of fibers 30 and 34. Those skilled in the art will recognize that fiber network 26 need not have such a uniform woven pattern of fibers 30 and 34. Alternatively, fiber network 26 may exhibit a relatively non-uniform woven pattern that still provides sufficient structural stability in both of directions 32 and 36.

Liner 24 of adhesive film 22 has an adhesive side 38 that includes a silicone polymer adhesive material 40 upon which IC dies (discussed below) are placed during the execution of IC die packaging process 20 (FIG. 1). Silicone adhesive material 40 is utilized herein due to its ability to cleanly release from adhesion with an IC die. In other embodiments, other existing or upcoming adhesive materials that can cleanly release from adhesion with IC dies may alternatively be utilized.

Referring back to FIG. 1, IC die packaging process 20 begins with a task 42. At task 42, a mold frame is attached to adhesive side 38 (FIG. 2) of adhesive film 22 (FIG. 2). FIG. 4 shows a top view of structurally reinforced adhesive film 22 with an attached mold frame 44 that together form an open mold cavity or a structure 46 for temporarily holding at least one integrated circuit (IC) die, not shown, during packaging thereof. Mold frame 44 additionally facilitates the handling of structure 46. When mold frame 44 is attached to adhesive film 22, adhesive film 22 forms a bottom portion of structure 46 and mold frame forms an outer perimeter of structure 46 extending from adhesive film 22. In one embodiment, mold frame 44 is a generally ring-shaped structure. However, mold frame 44 may be various shapes and sizes in accordance with the IC die packaging machinery that is to be used.

Figure 5:
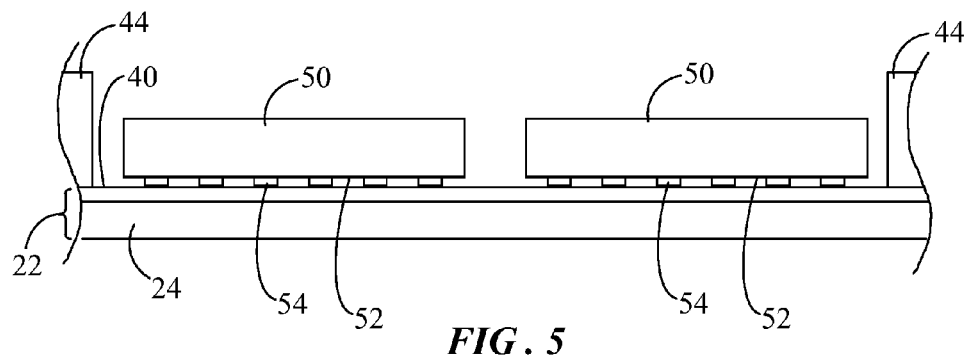
FIG. 5 shows a side view of a portion of a number of IC dies at a beginning stage of packaging in accordance with the IC die packaging process of FIG. 1.

With reference back to FIG. 1, following task 42, a task 48 is performed. At task 48, individual IC dies are placed on adhesive side 38 (FIG. 2) of structurally reinforced film 22 (FIG. 2). FIG. 5 shows a side view of a portion of a number of IC dies 50 at a beginning stage of packaging in accordance with IC die packaging process 20 of FIG. 1. IC dies 50 are placed onto structurally reinforced film 22 within mold frame 44 with an active surface 52 of each of IC dies 50 face down on adhesive material 40. Active surface 52 of IC dies 50 refers to that side of each of IC dies 50 having bond pads 54. Task 48 may also entail the attachment of an embedded ground plane (not shown) onto adhesive material 40 in accordance with pre-determined design requirements for the chip module.

In the embodiment shown, the method is discussed in connection with the packaging of individual IC dies 50. However, the methodology applies equally to the packaging of multi-chip modules, each of which includes multiple individual IC dies that can perform various functions. In addition, the following figures only show two of IC dies 50 for simplicity of illustration. Those skilled in the art will understand, that structure 46 (FIG. 4) may be sized to contain a multiplicity of IC dies 50 (or multi-chip modules) for concurrent packaging.

Figure 6:
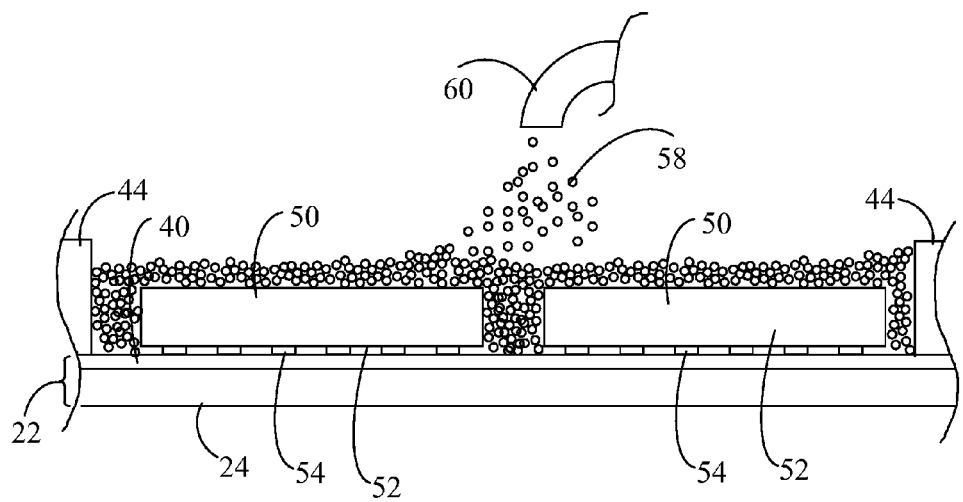
FIG. 6 shows a side view of the portion of IC dies shown in FIG. 5 further along in processing.

With reference back to FIG. 1, following task 48, a task 56 is performed. At task 56, a molding compound is dispensed over said IC dies 50 (FIG. 5) within mold frame 44 (FIG. 4). Referring to FIG. 6 in connection with task 56, FIG. 6 shows a side view of the portion of IC dies 50 shown in FIG. 5 further along in processing. In one embodiment, a molding compound 58 is distributed over IC dies 50 and the gaps between IC dies 50 within mold frame 44 from a nozzle 60 of conventional dispensing equipment.

Molding compound 58 may be an epoxy resin compound in granular form conventionally utilized for compression molding. Granular molding compound 58, such as granular epoxy resin, used in compression molding is approximately ten times less expensive then the liquid compounds utilized in conventional IC die packaging processes. In addition, granular molding compound 58 has a long shelf life, which makes material handling very clean and easy. It should be noted that granular molding compound 58 is unlikely to flow below active surface 52 of IC dies 50 and into contact with bond pads 54 due in part upon the size of the granules in molding compound 58, thereby mitigating the problems of resin bleed seen in the prior art that utilizes liquid compounds. Molding compound 58 in a granular form is preferred in one embodiment of the present invention. However, in alternative embodiments, molding compound 58 may be in other forms suitable for compression molding, such as pellets, powder, gels, liquids, and so forth.

Nozzle 60 appears close to IC dies 50 for simplicity of illustration. However, those skilled in the art will recognize that nozzle 60 may be at a height above IC dies 50 that best facilitates the distribution of granular molding compound 58 over IC dies 50. Furthermore, nozzle 60 may be in a multitude of configurations for effectively delivering molding compound 58 over IC dies 50. For example, nozzle 60 may be non-movable and provide a single dispensing of molding compound 58 from above. Alternatively, nozzle 60 may move in a circular pattern or line-by-line, i.e., IC die 50 by IC die 50, during the dispensing of granular molding compound 58.

Figure 7:
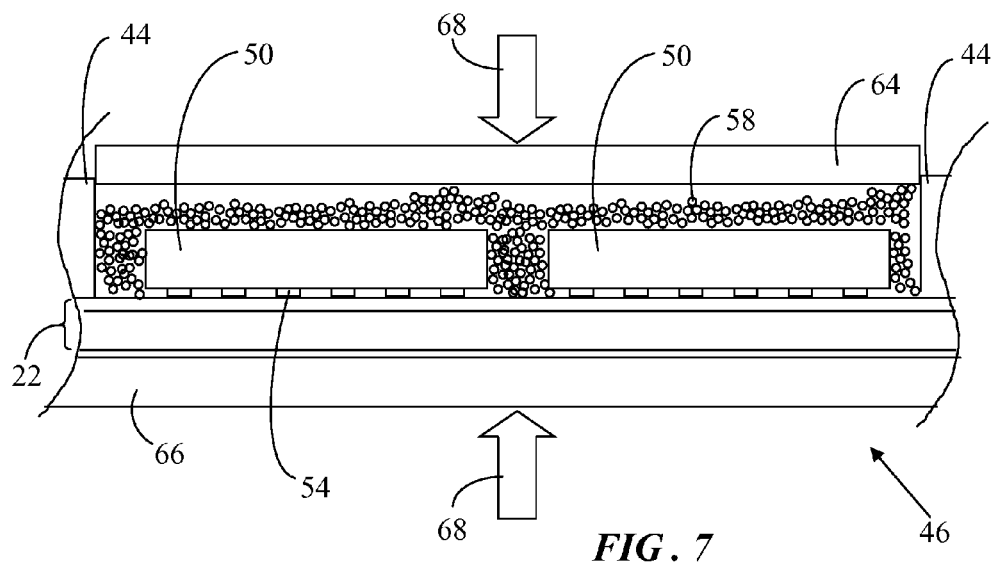
FIG. 7 shows a side view of the portion of IC dies shown in FIG. 6 further along in processing.

Referring back to FIG. 1, following task 56 in which granular molding compound 58 is dispensed over IC dies 50 within mold frame 44, packaging process 20 continues with a task 62. At task 62, a compression molding process is performed to form a compression molded encapsulant layer over IC dies 50. Referring to FIG. 7 in connection with task 62, FIG. 7 shows a side view of the portion of IC dies 50 shown in FIG. 6 further along in processing. In particular, FIG. 7 represents compression molding task 62 of process 20 (FIG. 1).

In general, compression molding is a method of molding in which the molding material, is placed in an open, heated mold cavity. In this scenario, granular molding compound 58 was placed in structure 46 (FIG. 3) which serves as a mold cavity for placement of IC dies 50. Structure 46 is closed with a plug member 64 and may be supported by an underlying surface or plate 66. Granular molding compound 58 is heated to an elevated temperature high enough to melt molding compound 58. The appropriate pressure is applied, represented by arrows 68, to force the melted molding compound 58 into contact with all mold areas. Heat and pressure are maintained until molding compound 58 has cured.

Compression molding is one of the least costly molding or encapsulation processes due in part to the low cost of molding compound 58. Moreover, granular molding compound 58 requires negligible thaw time, as opposed to liquid molding compounds which are stored frozen so as to prolong their shelf life. Furthermore, granular molding compound 58, used for compression molding, typically cures in approximately five minutes. This contrasts with the use of liquid molding compounds which call for an elevated temperature degassing and cure time of, for example, four hours, followed by subsequent backgrinding, cleaning, and baking operations. The use of flexible structurally reinforced single-sided adhesive film 22 enables the use of a compression molding technique that heretofore could not be utilized in connection with the standard structure of a support substrate and thermal release tape. Compression molding could not be used in the former processes because the elevated temperatures utilized for compression molding significantly degraded the adhesion properties of the thermal release tape causing excessive drift of IC dies 50.

Figure 8:
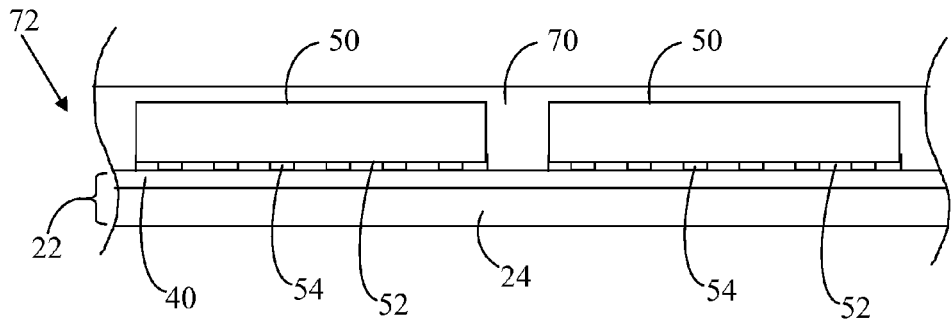
FIG. 8 shows a side view of the portion of IC dies shown in FIG. 7 further along in processing.

FIG. 8 shows a side view of the portion of IC dies 50 shown in FIG. 7 further along in processing. In response to the execution of compression molding task 62 (FIG. 1) an encapsulant layer 70 is formed over and between IC dies 50. That is, granular epoxy compound 58 (FIG. 7), having undergone compression molding, is now a solid, uniform encapsulant layer 70. Once IC dies 50 are encapsulated, a panel 72 containing multiple IC dies 50 is formed.

Referring back to FIG. 1, following compression molding task 62, IC die packing process continues with a task 74. At task 74, mold frame 44 (FIG. 4) is removed from structurally reinforced adhesive film 22 (FIG. 2).

Process 20 continues with a task 76. At task 76, the encapsulated IC dies 50 are released as a single unit, i.e., panel 72 (FIG. 8), from structurally reinforced adhesive film 22. For example, film 22 may be pulled away form panel 72 manually or utilizing the appropriate machinery. Silicone adhesive material 40 (FIG. 2) of film 22 readily releases or separates from active surface 52 of IC dies 50 and encapsulate layer 70 (FIG. 8). Any residual silicone adhesive material 40 may be cleaned away from bond pads 54 per conventional processes.

Figure 9:
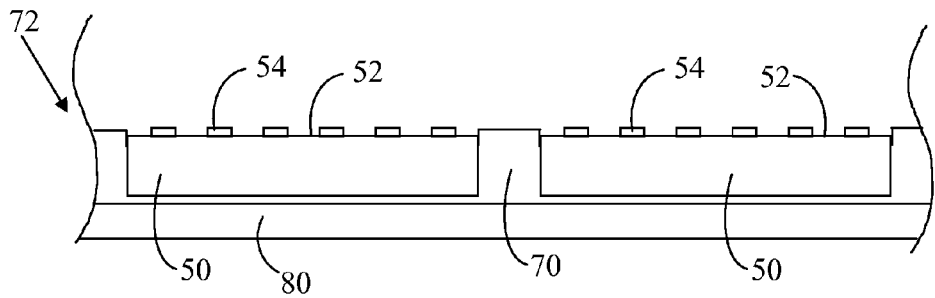
FIG. 9 shows a side view of the portion of IC dies shown in FIG. 8 further along in processing.

Next, a task 78 is performed. At task 78, panel 72 of IC dies 50 is attached to a carrier. Referring to FIG. 9 in connection with tasks 74, 76, and 78, FIG. 9 shows a side view of the portion of IC dies 50 shown in FIG. 8 further along in processing. As illustrated, adhesive film 22 (FIG. 2) has been removed from panel 72 of IC dies 50. In addition, panel 72 has been flipped such that encapsulant layer 70 contacts a carrier 80 and active surface 52 containing bond pads 54 of each of IC dies 50 is exposed. Panel 72 may undergo a final curing process to allow encapsulant layer 70 to further harden.

Figure 10:
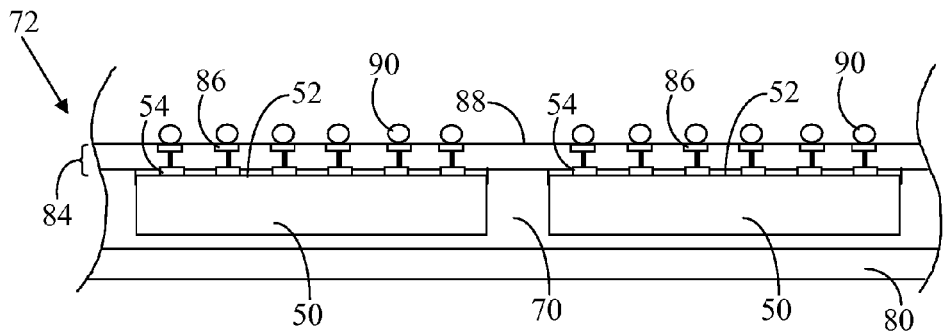
FIG. 10 shows a side view of the portion of IC dies shown in FIG. 9 further along in processing.

Referring back to FIG. 1, following task 78, a task 82 is performed. At task 82, panel 72 of IC dies 50 undergoes processing to form interconnects on active surface 52 of each of IC dies 50 in order to route signals, power, and ground lines between bond pads 54 on active surface 52 of each of IC dies 50. Referring to FIG. 10, FIG. 10 shows a side view of the portion of IC dies 50 shown in FIG. 9 further along in processing. Routing may be performed using standard silicon manufacturing equipment. These processing steps can include the deposition of copper metallization layers by electroplating techniques. The metal layers are generally separated by insulating layers typically formed from a spin-coated photoimageable dielectric, and patterned using batch process lithography. The combination of metal layers and insulating layers are collectively represented by a representative layer 84 in FIG. 10. The number of metal layers in a package is dictated by the package size, land grid array or ball grid array pitch requirement, input/output count, power and ground requirements, and routing design rules. The metal layers connect bond pads 54 on active surface 52 to pads 86 placed on an exterior surface 88 of panel 72. Pads 86 can then be provided with a nickel-gold (NiAu) alloy or solder finish for land grid array (LGA) or solder balls 90 for ball grid array (BGA).

Referring back to IC die packaging process 20 of FIG. 1, following task 82, a task 92 is performed. At task 92, panel 72 is separated into individual IC die packages. Following task 92, IC die packaging process 20 exits.

Figure 11:
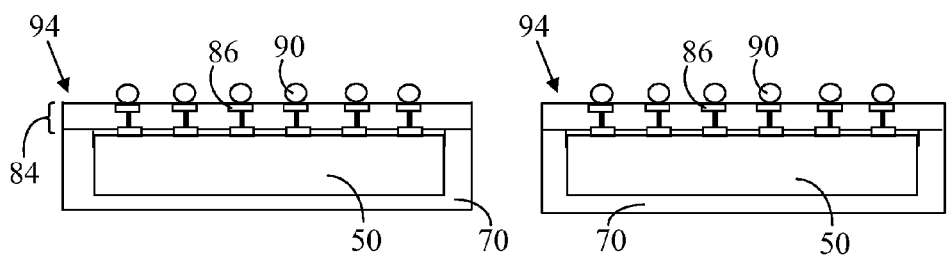
FIG. 11 shows a side view of IC dies packages resulting from execution of the IC die packaging process of FIG. 1.

FIG. 11 shows a side view of IC die packages 94 resulting from execution of IC die packaging process 20 of FIG. 1. At this point IC die packages 94 can be processed in accordance with known processes in preparation for their incorporation into electronic devices.

An embodiment described herein comprises a method of packaging an integrated circuit (IC) die. Packaging entails a chips-first methodology in which the package is built around the bare IC dies. Prior to IC die encapsulation, the IC dies are placed active side down on a flexible structurally reinforced silicone adhesive film that serves as an underlying support for the IC dies in lieu of the conventional thermal release tape used to secure IC dies onto a support substrate. Granular epoxy compound is dispensed over the IC dies and the IC dies within a mold frame undergo compression molding to form a panel of IC dies. The panel can be readily released from the reinforced silicone adhesive film. The use of flexible structurally reinforced silicone adhesive film, a granular molding compound, and a compression molding process for IC die encapsulation significantly reduces production complexity, production time, and manufacturing costs. Reduced production complexity and time for IC die encapsulation results from the elimination of extended cure durations, the elimination of backgrinding and cleaning operations, less equipment to clean, and no requirements for removing the encapsulated IC dies from an underlying support substrate. Such reductions, as well as the lower cost of granular epoxy compound, achieve significant manufacturing savings while concurrently producing high reliability components.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of packaging an integrated circuit (IC) die comprising:
    placing said IC die onto an exposed adhesive side of a flexible substrate;
    forming a compression molded encapsulant layer overlying said IC die from a molding compound; and
    releasing said IC die from said adhesive side of said flexible substrate.

2. A method as claimed in claim 1 further comprising attaching a mold frame to said exposed adhesive side of said flexible substrate about said IC die prior to forming said compression molded encapsulant layer.

3. A method as claimed in claim 1 further comprising utilizing a granular molding compound for said molding compound.

4. A method as claimed in claim 1 wherein said molding compound is a granular molding compound, and said forming operation comprises:

heating said granular molding compound to an elevated temperature to melt said compound;

distributing said melted molding compound over said IC die; and curing said distributed molding compound to form said compression molded IC die.

5. A method as claimed in claim 4 further comprising maintaining said molding compound at said elevated temperature throughout said curing operation.

6. A method as claimed in claim 4 further comprising applying pressure to said melted molding compound.

7. A method as claimed in claim 6 maintaining said molding compound at said elevated temperature and under pressure throughout said curing operation.

8. A method as claimed in claim 1 wherein said exposed adhesive side of said flexible substrate includes a silicone polymer adhesive.

9. A method as claimed in claim 1 wherein said flexible substrate comprises a structurally reinforced adhesive film.

10. A method as claimed in claim 9 wherein said structurally reinforced adhesive film comprises a fiber network reinforced single-sided adhesive film.

11. A method as claimed in claim 10 wherein said fiber network reinforced single-sided adhesive film includes first fibers oriented in a first direction and second fibers oriented in a second direction and interwoven with said first fibers, said second direction being orthogonal to said first direction.

12. A method as claimed in claim 11 wherein said adhesive film includes an approximately equivalent density of each of said first and said second fibers.

13. A method as claimed in claim 10 further comprising utilizing said fiber network reinforced single-sided adhesive film to provide structural stability at elevated temperatures sufficient to support said IC die in the absence of a support substrate during said forming operation.

14. A method as claimed in claim 1 wherein said IC die is one of multiple IC dies, and said method further comprises:

placing each of said multiple IC dies onto said exposed adhesive side of said structurally reinforced adhesive film;

concurrently encapsulating said multiple IC dies in said molding compound to form said compression molded encapsulant layer;

releasing said multiple IC dies from said adhesive side of said structurally reinforced adhesive film as a panel following said encapsulating operation; and separating said multiple IC dies of said panel to form individual IC packages.

15. A method as claimed in claim 14 wherein said placing operation positions an active surface of each of said multiple IC dies against said exposed adhesive side of said flexible substrate, and said method further comprises following said releasing operation forming interconnects on said active surface of said each of said multiple IC dies prior to said separating operation.

16. A method of packaging an integrated circuit (IC) die comprising:

placing said IC die onto an exposed adhesive side of a flexible structurally reinforced adhesive film;

forming a compression molded encapsulant layer overlying said IC die from a molding compound, said forming operation including utilizing said flexible structurally reinforced adhesive film to provide structural stability at elevated temperatures sufficient to support said IC die in the absence of a support substrate; and releasing said IC die from said adhesive side of said flexible substrate.

17. A method as claimed in claim 16 wherein said flexible structurally reinforced adhesive film includes first fibers oriented in a first direction and second fibers oriented in a second direction and interwoven with said first fibers, said second direction being orthogonal to said first direction, and said adhesive film includes an approximately equivalent density of each of said first and said second fibers.

* * * * *